United States Patent
Kean et al.

(10) Patent No.: US 10,536,176 B1
(45) Date of Patent: Jan. 14, 2020

(54) DYNAMIC ANTENNA MATCHING SYSTEM AND METHOD

(71) Applicant: Rockwell Collins, Inc., Cedar Rapids, IA (US)

(72) Inventors: Timothy L. Kean, Cedar Rapids, IA (US); David W. Rowland, Cedar Rapids, IA (US)

(73) Assignee: Rockwell Collins, Inc., Cedar Rapids, IA (US)

( * ) Notice: Subject to any disclaimer, the term of this patent is extended or adjusted under 35 U.S.C. 154(b) by 0 days.

(21) Appl. No.: 16/394,387

(22) Filed: Apr. 25, 2019

(51) Int. Cl.
*H04B 17/00* (2015.01)
*H04B 1/04* (2006.01)
*H03H 11/30* (2006.01)
*H04B 17/19* (2015.01)

(52) U.S. Cl.
CPC ........... *H04B 1/0458* (2013.01); *H03H 11/30* (2013.01); *H04B 17/19* (2015.01)

(58) Field of Classification Search
CPC ............ H04B 17/0067; H04B 17/0085; H04B 17/12; H04B 17/24; H04B 1/0458; H03H 11/30; H04W 52/0261; H03G 3/20
See application file for complete search history.

(56) References Cited

U.S. PATENT DOCUMENTS

| | | |
|---|---|---|
| 8,421,548 B2 | 4/2013 | Spears et al. |
| 8,620,246 B2 | 12/2013 | McKinzie et al. |
| 9,049,664 B2 * | 6/2015 | Liu .................... H04W 52/0261 |
| 9,325,062 B2 | 4/2016 | Pajona et al. |
| 2010/0261442 A1 * | 10/2010 | Paculdo .............. H04B 1/0458 455/110 |
| 2011/0086600 A1 * | 4/2011 | Muhammad ......... H04B 1/0458 455/120 |
| 2014/0329472 A1 * | 11/2014 | Kovacs ............. H04B 17/0085 455/67.14 |

OTHER PUBLICATIONS

Rhea, Randy, "The Yin-Yang of Matching: Part 1—Basic Matching Concepts", High Frequency Electronics, Mar. 2006, 8 pages.
Rhea, Randy, "The Yin-Yang of Matching: Part 2—Practical Matching Techniques", High Frequency Electronics, Apr. 2006, 8 pages.

* cited by examiner

*Primary Examiner* — Thanh C Le
(74) *Attorney, Agent, or Firm* — Suiter Swantz pc llo (57) ABSTRACT

An antenna matching system includes an electronically tunable antenna matching circuit, a first directional coupler, a first gain and phase detector, a second directional coupler, a second gain and phase detector, and a controller. The first directional coupler is configured to receive forward and reflected signals. The first gain and phase detector is configured to output a first magnitude measurement and a first phase measurement based on the signals received at the first directional coupler. The second directional coupler is also configured to receive the forward and reflected signals. The second gain and phase detector is configured to output a second magnitude measurement based on the signals received at the second directional coupler. The controller is configured to: determine circuit parameters based on the first magnitude and phase measurements; tune the matching circuit based on the circuit parameters; and check for phase error based on the second magnitude measurement.

20 Claims, 4 Drawing Sheets

DYNAMIC ANTENNA MATCHING SYSTEM AND METHOD

BACKGROUND

Some antennas (e.g., VHF/UHF man-portable and vehicular antennas used for military communications) are a poor impedance match to their respective transmitters, with voltage standing wave ratios (VSWRs) as high as 4 to 1. To reduce the mismatch, banded antennas that require swapping to change between frequency ranges may be used. In spite of being optimized over a narrow band of frequencies, these antennas still require lossy matching networks in their base to achieve a "better" VSWR. These networks may improve the load seen by the transmitter, but result in high loss and low gain. Consequently, there is a need for a high-speed, automatic antenna matching network between the transmitter and antenna to reactively improve the impedance match.

SUMMARY

A system for dynamic antenna matching is disclosed. In one or more embodiments, the system includes an electronically tunable antenna matching circuit, a first directional coupler, a first gain and phase detector, a second directional coupler, a second gain and phase detector, and a controller. The electronically tunable antenna matching circuit is communicatively coupled between a transmitter and an antenna. The first directional coupler is communicatively coupled between the antenna and the electronically tunable antenna matching circuit. The first directional coupler is configured to receive a forward signal from the transmitter and a reflected signal from the antenna. The first gain and phase detector is communicatively coupled to the first directional coupler. The first gain and phase detector is configured to output a first magnitude measurement and a first phase measurement based on the forward signal and the reflected signal received at the first directional coupler. The second directional coupler is communicatively coupled between the transmitter and the electronically tunable antenna matching circuit. The second directional coupler is configured to receive the forward signal from the transmitter and the reflected signal from the electronically tunable antenna matching circuit. The second gain and phase detector is communicatively coupled to the second directional coupler. The second gain and phase detector is configured to output a second magnitude measurement based on the forward signal and the reflected signal received at the second directional coupler. The controller is communicatively coupled to the first gain and phase detector, the second gain and phase detector, and the electronically tunable antenna matching circuit. The controller is configured to determine a set of circuit parameters for the electronically tunable antenna matching circuit based on the first magnitude measurement and the first phase measurement. The controller is further configured to tune the electronically tunable antenna matching circuit based on the set of circuit parameters. The controller is further configured to check for phase error after tuning the electronically tunable antenna matching circuit based on the second magnitude measurement.

In some embodiments of the system, the controller is further configured to retune the electronically tunable antenna matching circuit in response to a detected phase error.

In some embodiments of the system, the detected phase error corresponds to a 180-degree phase offset between the forward signal and the reflected signal after tuning the electronically tunable antenna matching circuit based on the set of circuit parameters.

In some embodiments of the system, the electronically tunable antenna matching circuit includes a plurality of capacitors, a plurality of inductors, and a plurality of electronic switches configured to selectively enable respective capacitors of the plurality of capacitors and respective inductors of the plurality of inductors in response to one or more control signals from the controller.

In some embodiments of the system, the controller is configured to tune the electronically tunable antenna matching circuit by generating the one or more control signals for the plurality of electronic switches to selectively enable respective capacitors of the plurality of capacitors and respective inductors of the plurality of inductors based on the set of circuit parameters determined for the electronically tunable antenna matching circuit.

In some embodiments of the system, the set of circuit parameters includes a capacitance value and an inductance value based on the first magnitude measurement and the first phase measurement.

In some embodiments of the system, the one or more control signals are based on a tune word selected by the controller from a lookup table including a plurality of tune words associated with respective capacitance and inductance values.

A transmission system that includes the system for dynamic antenna matching is also disclosed. In one or more embodiments, the transmission system includes a transmitter, an antenna configured to wirelessly transmit signals generated by the transmitter, and an antenna matching system communicatively coupled between the transmitter and the antenna. The antenna matching system includes an electronically tunable antenna matching circuit, a first directional coupler, a first gain and phase detector, a second directional coupler, a second gain and phase detector, and a controller. The electronically tunable antenna matching circuit is communicatively coupled between the transmitter and the antenna. The first directional coupler is communicatively coupled between the antenna and the electronically tunable antenna matching circuit. The first directional coupler is configured to receive a forward signal from the transmitter and a reflected signal from the antenna. The first gain and phase detector is communicatively coupled to the first directional coupler. The first gain and phase detector is configured to output a first magnitude measurement and a first phase measurement based on the forward signal and the reflected signal received at the first directional coupler. The second directional coupler is communicatively coupled between the transmitter and the electronically tunable antenna matching circuit. The second directional coupler is configured to receive the forward signal from the transmitter and the reflected signal from the electronically tunable antenna matching circuit. The second gain and phase detector is communicatively coupled to the second directional coupler. The second gain and phase detector is configured to output a second magnitude measurement based on the forward signal and the reflected signal received at the second directional coupler. The controller is communicatively coupled to the first gain and phase detector, the second gain and phase detector, and the electronically tunable antenna matching circuit. The controller is configured to determine a set of circuit parameters for the electronically tunable antenna matching circuit based on the first magnitude measurement and the first phase measurement. The controller is further configured to tune the electronically tunable antenna matching circuit based on the set of circuit parameters. The controller is further configured to check for phase error after tuning the electronically tunable antenna matching circuit based on the second magnitude measurement.

In some embodiments of the transmission system, the controller is further configured to retune the electronically tunable antenna matching circuit in response to a detected phase error.

In some embodiments of the transmission system, the detected phase error corresponds to a 180-degree phase offset between the forward signal and the reflected signal after tuning the electronically tunable antenna matching circuit based on the set of circuit parameters.

In some embodiments of the transmission system, the electronically tunable antenna matching circuit includes a plurality of capacitors, a plurality of inductors, and a plurality of electronic switches configured to selectively enable respective capacitors of the plurality of capacitors and respective inductors of the plurality of inductors in response to one or more control signals from the controller.

In some embodiments of the transmission system, the controller is configured to tune the electronically tunable antenna matching circuit by generating the one or more control signals for the plurality of electronic switches to selectively enable respective capacitors of the plurality of capacitors and respective inductors of the plurality of inductors based on the set of circuit parameters determined for the electronically tunable antenna matching circuit.

In some embodiments of the transmission system, the set of circuit parameters includes a capacitance value and an inductance value based on the first magnitude measurement and the first phase measurement.

In some embodiments of the transmission system, the one or more control signals are based on a tune word selected by the controller from a lookup table including a plurality of tune words associated with respective capacitance and inductance values.

A method of tuning an electronically tunable antenna matching circuit communicatively coupled between a transmitter and an antenna is also disclosed. In one or more embodiments, the method includes: receiving a forward signal from the transmitter and a reflected signal from the antenna at a first directional coupler communicatively coupled between the antenna and the electronically tunable antenna matching circuit; performing a first magnitude measurement and a first phase measurement based on the forward signal and the reflected signal received at the first directional coupler; receiving the forward signal from the transmitter and the reflected signal from the electronically tunable antenna matching circuit at a second directional coupler communicatively coupled between the transmitter and the electronically tunable antenna matching circuit; performing a second magnitude measurement based on the forward signal and the reflected signal received at the second directional coupler; determining a set of circuit parameters for the electronically tunable antenna matching circuit based on the first magnitude measurement and the first phase measurement; tuning the electronically tunable antenna matching circuit based on the set of circuit parameters; and checking for phase error after tuning the electronically tunable antenna matching circuit based on the second magnitude measurement.

In some embodiments of the method, the method further includes retuning the electronically tunable antenna matching circuit in response to a detected phase error.

In some embodiments of the method, the detected phase error corresponds to a 180-degree phase offset between the forward signal and the reflected signal after tuning the electronically tunable antenna matching circuit based on the set of circuit parameters.

In some embodiments of the method, the electronically tunable antenna matching circuit includes a plurality of capacitors, a plurality of inductors, and a plurality of electronic switches configured to selectively enable respective capacitors of the plurality of capacitors and respective inductors of the plurality of inductors in response to one or more control signals from the controller.

In some embodiments of the method, the electronically tunable antenna matching circuit is tuned by generating the one or more control signals for the plurality of electronic switches to selectively enable respective capacitors of the plurality of capacitors and respective inductors of the plurality of inductors based on the set of circuit parameters determined for the electronically tunable antenna matching circuit.

In some embodiments of the method, the set of circuit parameters includes a capacitance value and an inductance value based on the first magnitude measurement and the first phase measurement, and wherein the one or more control signals are based on a tune word selected from a lookup table including a plurality of tune words associated with respective capacitance and inductance values.

This Summary is provided solely as an introduction to subject matter that is fully described in the Detailed Description and Drawings. The Summary should not be considered to describe essential features nor be used to determine the scope of the Claims. Moreover, it is to be understood that both the foregoing Summary and the following Detailed Description are example and explanatory only and are not necessarily restrictive of the subject matter claimed.

BRIEF DESCRIPTION OF THE DRAWINGS

The detailed description is described with reference to the accompanying figures. The use of the same reference numbers in different instances in the description and the figures may indicate similar or identical items. Various embodiments or examples ("examples") of the present disclosure are disclosed in the following detailed description and the accompanying drawings. The drawings are not necessarily to scale. In general, operations of disclosed processes may be performed in an arbitrary order, unless otherwise provided in the claims. In the drawings:

DETAILED DESCRIPTION

Before explaining one or more embodiments of the disclosure in detail, it is to be understood that the embodiments are not limited in their application to the details of construction and the arrangement of the components or steps or methodologies set forth in the following description or illustrated in the drawings. In the following detailed description of embodiments, numerous specific details may be set forth in order to provide a more thorough understanding of the disclosure. However, it will be apparent to one of ordinary skill in the art having the benefit of the instant disclosure that the embodiments disclosed herein may be practiced without some of these specific details. In other instances, well-known features may not be described in detail to avoid unnecessarily complicating the instant disclosure.

As used herein a letter following a reference numeral is intended to reference an embodiment of the feature or element that may be similar, but not necessarily identical, to a previously described element or feature bearing the same reference numeral (e.g., 1, 1a, 1b). Such shorthand notations are used for purposes of convenience only and should not be construed to limit the disclosure in any way unless expressly stated to the contrary.

Further, unless expressly stated to the contrary, "or" refers to an inclusive or and not to an exclusive or. For example, a condition A or B is satisfied by anyone of the following: A is true (or present) and B is false (or not present), A is false (or not present) and B is true (or present), and both A and B are true (or present).

In addition, use of "a" or "an" may be employed to describe elements and components of embodiments disclosed herein. This is done merely for convenience and "a" and "an" are intended to include "one" or "at least one," and the singular also includes the plural unless it is obvious that it is meant otherwise.

Finally, as used herein any reference to "one embodiment" or "some embodiments" means that a particular element, feature, structure, or characteristic described in connection with the embodiment is included in at least one embodiment disclosed herein. The appearances of the phrase "in some embodiments" in various places in the specification are not necessarily all referring to the same embodiment, and embodiments may include one or more of the features expressly described or inherently present herein, or any combination of sub-combination of two or more such features, along with any other features which may not necessarily be expressly described or inherently present in the instant disclosure.

A system for dynamic antenna matching is disclosed. Some antennas (e.g., VHF/UHF man-portable and vehicular antennas used for military communications) are a poor impedance match to their respective transmitters, with voltage standing wave ratios (VSWRs) as high as 4 to 1. To reduce the mismatch, banded antennas that require swapping to change between frequency ranges may be used. In spite of being optimized over a narrow band of frequencies, these antennas still require lossy matching networks in their base to achieve a "better" VSWR. These networks may improve the load seen by the transmitter, but result in high loss and low gain. However, the disclosed system allows for a high-speed, automatic antenna matching network between the transmitter and antenna to reactively improve the impedance match, resulting in a near optimum load to the transmitter. Some benefits of the disclosed system may include, but are not limited to, reduced power consumption, less transmitter stress, higher antenna gain, improved receive performance, and/or greater flexibility for the radio operator.

Figure 1A:
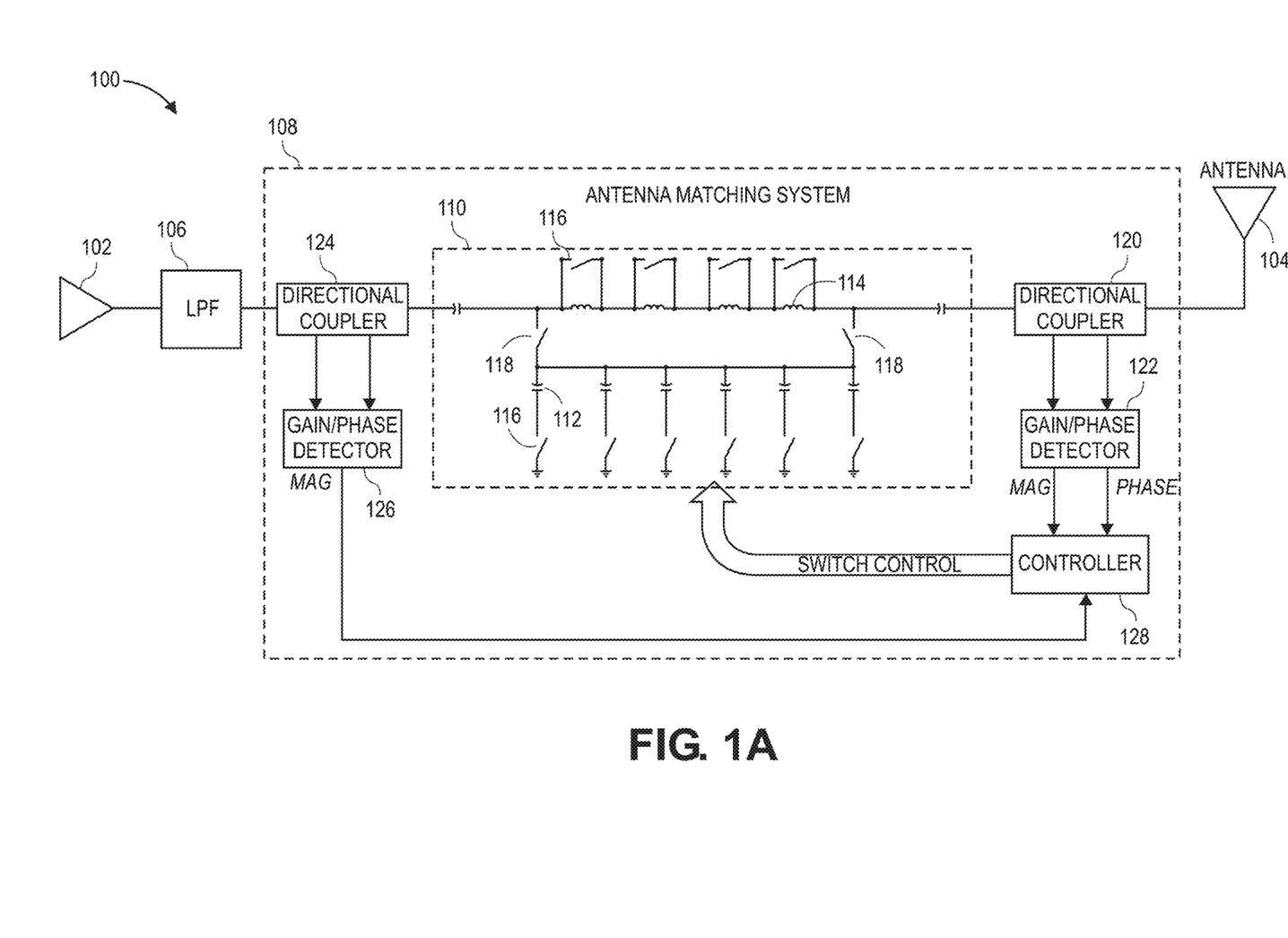
FIG. 1A is a block diagram illustrating a transmission system that includes an antenna matching system, in accordance with one or more embodiments of this disclosure.

FIG. 1A illustrates a transmission system 100, in accordance with an example embodiment of the present disclosure. In embodiments, the transmission system 100 includes a transmitter 102 (e.g., a wireless transmitter or transceiver). The transmission system 100 further includes an antenna 104 configured to wirelessly transmit signals generated by the transmitter 102. The antenna 104 may be of any shape or form known in the art to transmit electromagnetic signals. For example, the antenna 104 may be a directional antenna, omnidirectional antenna, or the like.

The transmission system 100 further includes an antenna matching system 108 coupled between the transmitter 102 and the antenna 104. The antenna matching system 108 includes an electronically tunable antenna matching circuit 110 for matching the impedance of the transmitter 102 to the impedance of the antenna 104. In this regard, the electronically tunable antenna matching circuit 110 is configured to be coupled between the transmitter 102 and the antenna 104. In some embodiments, the transmission system 100 further includes a low pass filter (LPF) 106 communicatively coupled between the transmitter 102 and the antenna matching system 108. The LPF 106 may be configured to filter out high-frequency signals while allowing transmission of low-frequency signals from the transmitter 102 to the antenna matching system 108.

In embodiments, the electronically tunable antenna matching circuit 110 includes a plurality of capacitors 112, a plurality of inductors 114, and a plurality of electronic switches 116 (e.g., transistors or transistor-based switches). The electronic switches 116 are configured to selectively enable respective capacitors 112 of the plurality of capacitors 112 and respective inductors 114 of the plurality of inductors 114 in response to one or more control signals from a controller 128. In some embodiments, the electronically tunable antenna matching circuit 110 further includes electronic switches 118 for controlling a circuit configuration of the capacitors 112 and inductors 114 in the electronically tunable electronic circuit 110. For example, the switches 118 can selectively opened or closed by the controller 128 to alter the circuit configuration by disposing the capacitors 112 ahead of the inductors 114 in the reflected signal pathway from the antenna 104 to the transmitter 102, or alternatively by disposing the inductors 114 ahead of the capacitors 112, or by placing the inductors 114 and capacitors 112 in parallel, or forming other circuit configurations to achieve appropriate circuit parameters for matching the impedance of the antenna 104 to the impedance of the transmitter 102.

The antenna matching system 108 further includes a first directional coupler 120. The first directional coupler 120 is configured to be communicatively coupled between the antenna 104 and the electronically tunable antenna matching circuit 110. The first directional coupler 120 is configured to receive a forward signal from the transmitter 102 and a reflected signal from the antenna 104. Once the signal passes through the first directional coupler 120, the first directional coupler 120 is capable of sampling a portion of the signal. The first directional coupler 120 may be of any directional coupler known in the art capable of coupling power flow. For example, the first directional coupler 120 may be a coaxial directional coupler, planar directional coupler, or the like.

The first directional coupler 120 may be communicatively coupled to a first gain and phase detector 122 (sometimes referred to herein and in the drawings as a "gain/phase detector"). The first gain and phase detector 122 is configured to output a first magnitude measurement and a first phase measurement based on the forward signal and the reflected signal received at the first directional coupler 120.

The first gain and phase detector 122 may be any detector known in the art capable of measuring the amplitude and phase between two electromagnetic signals. For example, the first gain and phase detector 122 may be an integrated radio frequency (RF) detector (e.g., the AD8302 RF/IF Gain Phase Detector manufactured by Analog Devices, Inc.) or the like.

In embodiments, the electronically tunable antenna matching circuit further includes a second directional coupler 124. The second directional coupler 124 is configured to be communicatively coupled between the transmitter 102 and the electronically tunable antenna matching circuit 110. The second directional coupler 124 may be configured to receive the forward signal from the transmitter 102 and the reflected signal from the antenna 104. Once the signal passes through the second directional coupler 124, the second directional coupler 124 is capable of sampling a portion of the signal. The second directional coupler 124 may be of any directional coupler known in the art capable of coupling power flow. For example, the second directional coupler 124 may also be a coaxial directional coupler, planar directional coupler, or the like.

The second directional coupler 124 may be communicatively coupled to a second gain and phase detector 126. The second gain and phase detector 126 is configured to output a second magnitude measurement based on the forward signal and the reflected signal received at the second directional coupler 124. In this regard, the second directional coupler 124 and second gain and phase detector 126 can be configured to collect a second magnitude measurement for the forward signal and reflected signal after the reflected signal has passed through the electronically tunable antenna matching circuit 110. The second gain and phase detector 126 may be any detector known in the art capable of measuring the amplitude and phase between two electromagnetic signals. For example, the second gain and phase detector 126 may also be an integrated RF detector or the like.

Figure 1B:
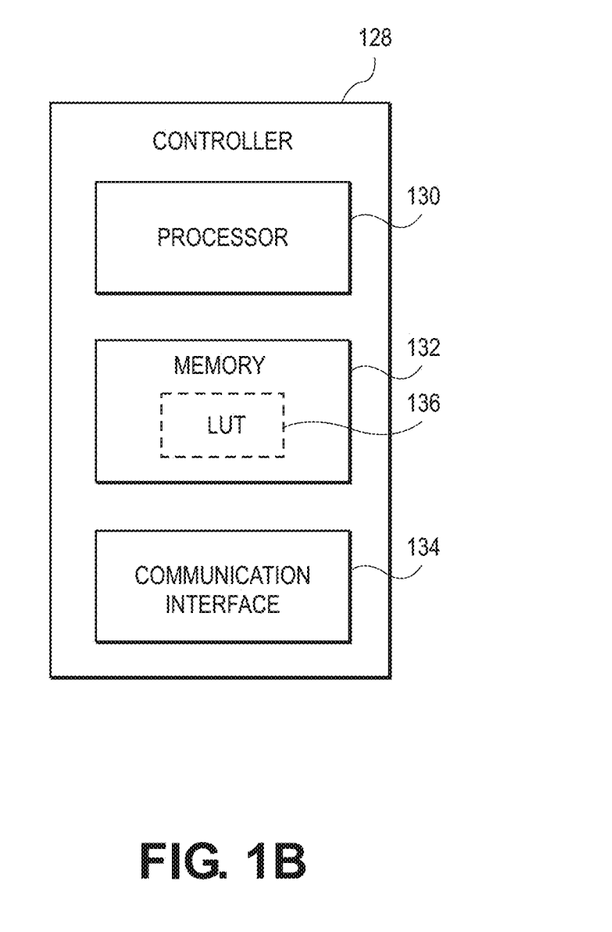
FIG. 1B is a block diagram illustrating a controller of the antenna matching system, in accordance with one or more embodiments of this disclosure.

The controller 128 may be communicatively coupled to the first gain and phase detector 122, the second gain and phase detector 126, and the electronically tunable antenna matching circuit 110. As shown in FIG. 1B, the controller 128 may include at least one processor 130, memory 132, and communication interface 134.

The processor 130 is configured to provide processing functionality for at least the controller 128 and can include any number of processors, micro-controllers, circuitry, field programmable gate array (FPGA) or other processing systems, and resident or external memory for storing data, executable code, and other information accessed or generated by the controller 128. The processor 130 is configured to execute one or more software programs embodied in a non-transitory computer readable medium (e.g., memory 132) that implement techniques described herein. The processor 130 is not limited by the materials from which it is formed or the processing mechanisms employed therein and, as such, can be implemented via semiconductor(s) and/or transistors (e.g., using electronic integrated circuit (IC) components), and so forth.

The memory 132 can be an example of tangible, computer-readable storage medium that provides storage functionality to store various data and/or program code associated with operation of the controller 128/processor 130, such as software programs and/or code segments, or other data to instruct the processor 130, and possibly other components of the controller 128, to perform the functionality described herein. Thus, the memory 132 can store data, such as a program of instructions for operating the controller 128, including its components (e.g., processor 130, communication interface 134, etc.), and so forth. It should be noted that while a single memory 132 is described, a wide variety of types and combinations of memory (e.g., tangible, non-transitory memory) can be employed. The memory 132 can be integral with the processor 130, can comprise stand-alone memory, or can be a combination of both. Some examples of the memory 132 can include removable and non-removable memory components, such as random-access memory (RAM), read-only memory (ROM), flash memory (e.g., a secure digital (SD) memory card, a mini-SD memory card, and/or a micro-SD memory card), solid-state drive (SSD) memory, magnetic memory, optical memory, universal serial bus (USB) memory devices, hard disk memory, external memory, and so forth.

The communication interface 134 can be operatively configured to communicate with components of the controller 128. For example, the communication interface 134 can be configured to retrieve data from the processor 130 or other devices (e.g., gain/phase detector 122, gain/phase detector 126, etc.), transmit data for storage in the memory 132, retrieve data from storage in the memory 132, and so forth. The communication interface 134 can also be communicatively coupled with the processor 130 to facilitate data transfer between components of the controller 128 and the processor 130. It should be noted that while the communication interface 134 is described as a component of the controller 128, one or more components of the communication interface 134 can be implemented as external components communicatively coupled to the controller 128 via a wired and/or wireless connection. The controller 128 can also include and/or connect to one or more input/output (I/O) devices. In embodiments, the communication interface 134 includes or is coupled to a transmitter, receiver, transceiver, physical connection interface, or any combination thereof.

In embodiments, the controller 128 is configured to determine a set of circuit parameters (e.g., capacitance and inductance values) for the electronically tunable antenna matching circuit 110 based on the first magnitude measurement and the first phase measurement. The controller 128 is further configured to tune the electronically tunable antenna matching circuit 110 based on the set of circuit parameters. For example, the controller 128 may be configured to tune the electronically tunable antenna matching circuit 110 by generating the one or more control signals for the electronic switches 116, 118 to selectively enable respective capacitors 112 of the plurality of capacitors 112 and respective inductors 114 of the plurality of inductors 114 based on the set of circuit parameters determined for the electronically tunable antenna matching circuit 110. In embodiments of the antenna matching system 108, the circuit parameters include a capacitance value (C) and an inductance value (L) based on the first magnitude measurement and the first phase measurement determined by the first gain and phase detector 122. In some embodiments, the one or more control signals are based on a tune word (e.g., a bit sequence) selected by the controller 128 from a lookup table (LUT) 136 in memory 132. For example, the LUT 136 may include a plurality of tune words associated with respective capacitance (C) and inductance (L) values, or a plurality of tune words associated with respective magnitude and/or phase measurements. The controller 128 may be configured to output the tune word or one or more control signals based on the tune word to the electronic switches 116, 118, thereby causing selected switches 116/118 to close while others (if any) are left open, or vice versa.

In embodiments, the controller 128 is further configured to check for phase error after tuning the electronically tunable antenna matching circuit 110. The controller 128 may be configured to check for phase error based on the second magnitude measurement. For example, after tuning the electronically tunable antenna matching circuit 110 based on the first magnitude and phase measurements, if the second magnitude measurement indicates a difference between the impedance of the antenna 104 and the impedance of the transmitter 102 that is greater than a threshold difference, the controller 128 is configured to determine that a phase error exists. In some cases, the detected phase error corresponds to a 180-degree phase offset between the forward signal and the reflected signal after tuning the electronically tunable antenna matching circuit 110. Accordingly, the controller 128 may be configured to retune the electronically tunable antenna matching circuit 110 in response to the detected phase error (e.g., to account for the 180-degree phase offset). This allows for a quick correction when the first set of parameters for the electronically tunable matching circuit 110 is erroneous due to a 180-degree phase offset between the forward and reflected signals.

Figure 2A:
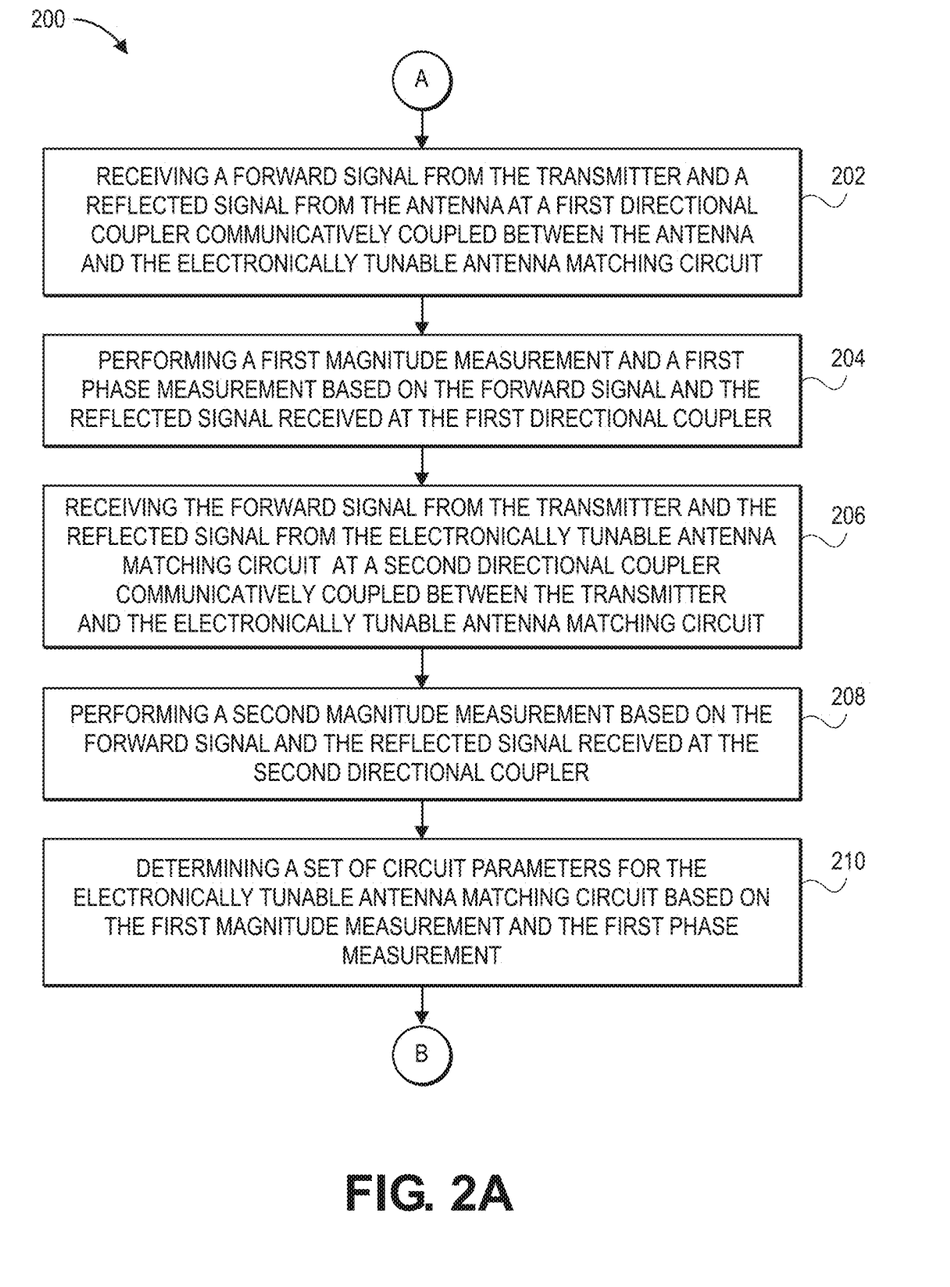
FIG. 2A is a portion of a flow diagram illustrating a method of tuning an electronically tunable antenna matching circuit, such as the electronically tunable antenna matching circuit of the antenna matching system illustrated in FIG. 1A, in accordance with one or more embodiments of this disclosure.
Figure 2B:
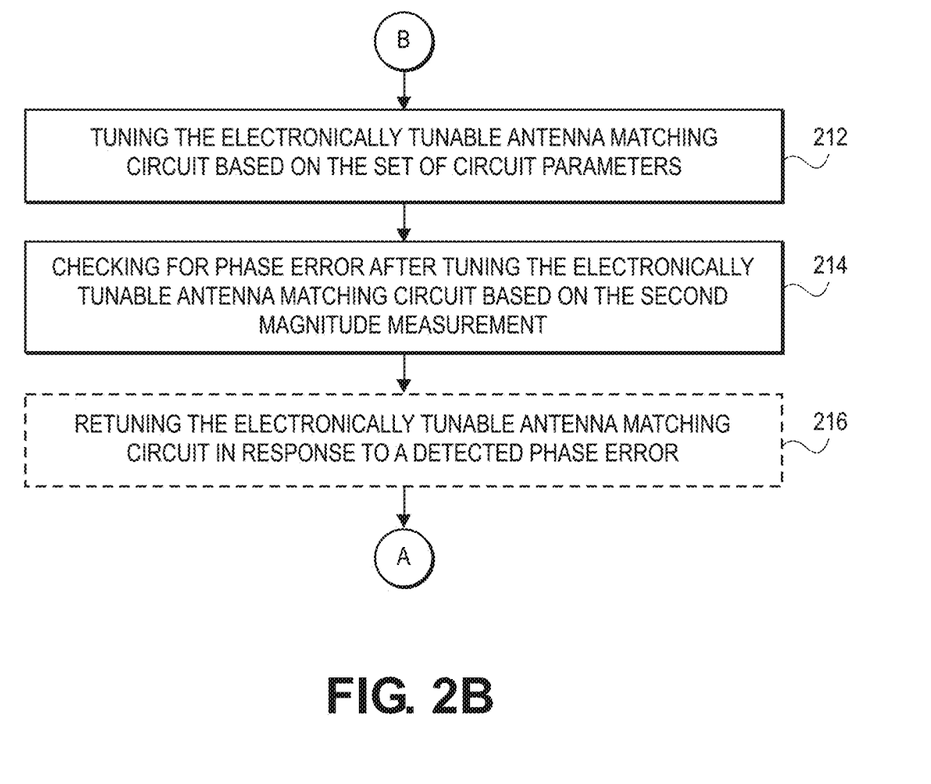
FIG. 2B is a portion of a flow diagram illustrating a method of tuning an electronically tunable antenna matching circuit, such as the electronically tunable antenna matching circuit of the antenna matching system illustrated in FIG. 1A, in accordance with one or more embodiments of this disclosure.

FIGS. 2A and 2B illustrates a method 200 of tuning an electronically tunable antenna matching circuit communicatively coupled between a transmitter and an antenna, such as the electronically tunable antenna matching circuit 110 of the antenna matching system 108 illustrated in FIG. 1A. The method 200 may be carried out by the transmission system 100/antenna matching system 108 described herein. In this regard, the transmission system 100/antenna matching system 108 may include any component/configuration required to carry out a step/function of the method 200; similarly, the method 200 may include any step/function that corresponds to a component/configuration of the transmission system 100/antenna matching system 108. For example, the processor 130 of controller 128 may be configured to carry out various steps and functions of the method 200 illustrated in FIGS. 2A and 2B.

At step 202, the method 200 includes receiving a forward signal from the transmitter 102 and a reflected signal from the antenna 104 at a first directional coupler 120 communicatively coupled between the antenna 104 and the electronically tunable antenna matching circuit 110. For example, the first directional coupler 120 may be configured to receive a forward signal originating from the transmitter 102 that has passed though the electronically tunable antenna matching circuit 110. At the same time, the first directional coupler 120 may be configured to also receive a reflected signal that, having reached the antenna, was reflected back into the transmission system 100.

At step 204, the method 200 includes performing a first magnitude measurement and a first phase measurement based on the forward signal and the reflected signal received at the first directional coupler 120. For example, the forward and reflected signal can be sampled by the first directional coupler 120 and at least partially received by the first gain and phase detector 122, which is communicatively coupled to the first directional coupler 120. The first gain and phase detector 122 can be configured to perform a first magnitude measurement and a first phase measurement based on the forward and reflected signals.

At step 206, the method 200 includes receiving the forward signal from the transmitter 102 and the reflected signal from the electronically tunable antenna matching circuit 110 at a second directional coupler 124 communicatively coupled between the transmitter 102 and the electronically tunable antenna matching circuit 110. For example, the second directional coupler 124 may be configured to receive a forward signal originating from the transmitter 102. At the same time, the second directional coupler 124 may be configured to also receive a reflected signal that, having reached the electronically tunable antenna matching circuit 110, was reflected back into the second directional coupler 124.

At step 208, the method 200 includes performing a second magnitude measurement based on the forward signal and the reflected signal received at the second directional coupler 124. For example, the forward and reflected signal can be sampled by the second directional coupler 124 and at least partially received by the second gain and phase detector 126, which is communicatively coupled to the second directional coupler 124. The second gain and phase detector 126 can be configured to perform a second magnitude measurement based on the forward and reflected signals.

At step 210, the method 200 includes determining a set of circuit parameters for the electronically tunable antenna matching circuit 110 based on the first magnitude measurement and the first phase measurement. For example, the controller 128 may be configured to determine a set of circuit parameters (e.g., capacitance and inductance values) for the electronically tunable antenna matching circuit 110 based on the first magnitude measurement and the first phase measurement. In some embodiments, the controller 128 is configured to determine the circuit parameters for the electronically tunable antenna matching circuit 110 by performing impedance matching computations, such as, but not limited to, the impedance matching computations/algorithms described by Rhea, Randy. "The Yin-Yang of Matching: Part 1—Basic Matching Concepts." (2006) and Rhea, Randy. "The Yin-Yang of Matching: Part 2—Practical Matching Techniques." (2006), which are fully incorporated herein by reference.

At step 212, the method 200 includes tuning the electronically tunable antenna matching circuit 110 based on the determined (e.g., calculated/estimated) circuit parameters. For example, the controller 128 can be configured to tune the electronically tunable antenna matching circuit 110 based on the set of circuit parameters. In embodiments, the controller 128 is configured to tune the electronically tunable antenna matching circuit 110 by generating the one or more control signals to for the electronic switches 116, 118 to selectively enable respective capacitors 112 of the plurality of capacitors 112 and respective inductors 114 of the plurality of inductors 114 based on the set of circuit parameters determined for the electronically tunable antenna matching circuit 110. In some embodiments, the one or more control signals are based on a tune word (e.g., a bit sequence) selected by the controller 128 from a lookup table (LUT) 136 in memory 132. For example, the LUT 136 may include a plurality of tune words associated with respective capacitance (C) and inductance (L) values, or a plurality of tune words associated with respective magnitude and/or phase measurements. The controller 128 may be configured to output the tune word or one or more control signals based on the tune word to the electronic switches 116, 118, thereby causing selected switches 116/118 to close while others (if any) are left open, or vice versa.

At step 214, the method 200 includes checking for phase error after tuning the electronically tunable antenna matching circuit 110 based on the second magnitude measurement. For example, after tuning the electronically tunable antenna matching circuit 110 based on the first magnitude and phase measurements, if the second magnitude measurement indicates a difference between the impedance of the antenna 104 and the impedance of the transmitter 102 that is greater than a threshold difference, the controller 128 may be configured to determine that a phase error exists.

In some embodiments, the method 200 further includes retuning the electronically tunable antenna matching circuit in response to a detected phase error (step 216). For example, the detected phase error may correspond to a 180-degree phase offset between the forward signal and the reflected signal after tuning the electronically tunable antenna matching circuit 110. Accordingly, the controller 128 may be configured to retune the electronically tunable antenna matching circuit 110 in response to the detected phase error (e.g., to account for the 180-degree phase offset). This allows for a quick correction when the first set of parameters for the electronically tunable matching circuit 110 is erroneous due to a 180-degree phase offset between the forward and reflected signals.

The method 200 may be repeated to retune the electronically tunable antenna matching circuit (e.g., electronically tunable matching circuit 110). For example, the method 200 may be performed a selected number of times or until predetermined (e.g., preselected/programmed) minimum VSWR is achieved. In some embodiments, the method 200 may be performed periodically (e.g., every X minutes, Y hours, Z days, etc.), according to a programmed schedule (e.g., at one or more specified days and/or times), or at one or more triggering events (e.g., startup, after a selected number of transmissions, in response to a failure event, when the VSWR drops below a predetermined threshold, in response to a user command, etc.).

It is to be understood that embodiments of the methods disclosed herein may include one or more of the steps described herein. Further, such steps may be carried out in any desired order and two or more of the steps may be carried out simultaneously with one another. Two or more of the steps disclosed herein may be combined in a single step, and in some embodiments, one or more of the steps may be carried out as two or more sub-steps. Further, other steps or sub-steps may be carried in addition to, or as substitutes to one or more of the steps disclosed herein.

Although inventive concepts have been described with reference to the embodiments illustrated in the attached drawing figures, equivalents may be employed and substitutions made herein without departing from the scope of the claims. Components illustrated and described herein are merely examples of a system/device and components that may be used to implement embodiments of the inventive concepts and may be replaced with other devices and components without departing from the scope of the claims. Furthermore, any dimensions, degrees, and/or numerical ranges provided herein are to be understood as non-limiting examples unless otherwise specified in the claims.

What is claimed is:

1. A system for dynamic antenna matching, comprising:
   an electronically tunable antenna matching circuit communicatively coupled between a transmitter and an antenna;
   a first directional coupler communicatively coupled between the antenna and the electronically tunable antenna matching circuit, the first directional coupler configured to receive a forward signal from the transmitter and a reflected signal from the antenna;
   a first gain and phase detector communicatively coupled to the first directional coupler, the first gain and phase detector configured to output a first magnitude measurement and a first phase measurement based on the forward signal and the reflected signal received at the first directional coupler;
   a second directional coupler communicatively coupled between the transmitter and the electronically tunable antenna matching circuit, the second directional coupler configured to receive the forward signal from the transmitter and the reflected signal from the electronically tunable antenna matching circuit;
   a second gain and phase detector communicatively coupled to the second directional coupler, the second gain and phase detector configured to output a second magnitude measurement based on the forward signal and the reflected signal received at the second directional coupler; and
   a controller communicatively coupled to the first gain and phase detector, the second gain and phase detector, and the electronically tunable antenna matching circuit, the controller configured to:
   determine a set of circuit parameters for the electronically tunable antenna matching circuit based on the first magnitude measurement and the first phase measurement;
   tune the electronically tunable antenna matching circuit based on the set of circuit parameters; and
   check for phase error after tuning the electronically tunable antenna matching circuit based on the second magnitude measurement.

2. The system of claim 1, wherein the controller is further configured to retune the electronically tunable antenna matching circuit in response to a detected phase error.

3. The system of claim 2, wherein the detected phase error corresponds to a 180-degree phase offset between the forward signal and the reflected signal after tuning the electronically tunable antenna matching circuit based on the set of circuit parameters.

4. The system of claim 1, wherein the electronically tunable antenna matching circuit includes:
   a plurality of capacitors;
   a plurality of inductors; and
   a plurality of electronic switches configured to selectively enable respective capacitors of the plurality of capacitors and respective inductors of the plurality of inductors in response to one or more control signals from the controller.

5. The system of claim 4, wherein the controller is configured to tune the electronically tunable antenna matching circuit by generating the one or more control signals for the plurality of electronic switches to selectively enable respective capacitors of the plurality of capacitors and respective inductors of the plurality of inductors based on the set of circuit parameters determined for the electronically tunable antenna matching circuit.

6. The system of claim 5, wherein the set of circuit parameters includes a capacitance value and an inductance value based on the first magnitude measurement and the first phase measurement.

7. The system of claim 6, wherein the one or more control signals are based on a tune word selected by the controller from a lookup table including a plurality of tune words associated with respective capacitance and inductance values.

8. A transmission system, comprising:
   a transmitter;
   an antenna configured to wirelessly transmit signals generated by the transmitter;

an electronically tunable antenna matching circuit communicatively coupled between the transmitter and the antenna;
a first directional coupler communicatively coupled between the antenna and the electronically tunable antenna matching circuit, the first directional coupler configured to receive a forward signal from the transmitter and a reflected signal from the antenna;
a first gain and phase detector communicatively coupled to the first directional coupler, the first gain and phase detector configured to output a first magnitude measurement and a first phase measurement based on the forward signal and the reflected signal received at the first directional coupler;
a second directional coupler communicatively coupled between the transmitter and the electronically tunable antenna matching circuit, the second directional coupler configured to receive the forward signal from the transmitter and the reflected signal from the electronically tunable antenna matching circuit;
a second gain and phase detector communicatively coupled to the second directional coupler, the second gain and phase detector configured to output a second magnitude measurement based on the forward signal and the reflected signal received at the second directional coupler; and
a controller communicatively coupled to the first gain and phase detector, the second gain and phase detector, and the electronically tunable antenna matching circuit, the controller configured to:
determine a set of circuit parameters for the electronically tunable antenna matching circuit based on the first magnitude measurement and the first phase measurement;
tune the electronically tunable antenna matching circuit based on the set of circuit parameters; and
check for phase error after tuning the electronically tunable antenna matching circuit based on the second magnitude measurement.

9. The transmission system of claim 8, wherein the controller is further configured to retune the electronically tunable antenna matching circuit in response to a detected phase error.

10. The transmission system of claim 9, wherein the detected phase error corresponds to a 180-degree phase offset between the forward signal and the reflected signal after tuning the electronically tunable antenna matching circuit based on the set of circuit parameters.

11. The transmission system of claim 8, wherein the electronically tunable antenna matching circuit includes:
a plurality of capacitors;
a plurality of inductors; and
a plurality of electronic switches configured to selectively enable respective capacitors of the plurality of capacitors and respective inductors of the plurality of inductors in response to one or more control signals from the controller.

12. The transmission system of claim 11, wherein the controller is configured to tune the electronically tunable antenna matching circuit by generating the one or more control signals for the plurality of electronic switches to selectively enable respective capacitors of the plurality of capacitors and respective inductors of the plurality of inductors based on the set of circuit parameters determined for the electronically tunable antenna matching circuit.

13. The transmission system of claim 12, wherein the set of circuit parameters includes a capacitance value and an inductance value based on the first magnitude measurement and the first phase measurement.

14. The transmission system of claim 13, wherein the one or more control signals are based on a tune word selected by the controller from a lookup table including a plurality of tune words associated with respective capacitance and inductance values.

15. A method of tuning an electronically tunable antenna matching circuit communicatively coupled between a transmitter and an antenna, comprising:
receiving a forward signal from the transmitter and a reflected signal from the antenna at a first directional coupler communicatively coupled between the antenna and the electronically tunable antenna matching circuit;
performing a first magnitude measurement and a first phase measurement based on the forward signal and the reflected signal received at the first directional coupler;
receiving the forward signal from the transmitter and the reflected signal from the electronically tunable antenna matching circuit at a second directional coupler communicatively coupled between the transmitter and the electronically tunable antenna matching circuit;
performing a second magnitude measurement based on the forward signal and the reflected signal received at the second directional coupler;
determining a set of circuit parameters for the electronically tunable antenna matching circuit based on the first magnitude measurement and the first phase measurement;
tuning the electronically tunable antenna matching circuit based on the set of circuit parameters; and
checking for phase error after tuning the electronically tunable antenna matching circuit based on the second magnitude measurement.

16. The method of claim 15, further comprising:
retuning the electronically tunable antenna matching circuit in response to a detected phase error.

17. The method of claim 16, wherein the detected phase error corresponds to a 180-degree phase offset between the forward signal and the reflected signal after tuning the electronically tunable antenna matching circuit based on the set of circuit parameters.

18. The method of claim 15, wherein the electronically tunable antenna matching circuit includes:
a plurality of capacitors;
a plurality of inductors; and
a plurality of electronic switches configured to selectively enable respective capacitors of the plurality of capacitors and respective inductors of the plurality of inductors in response to one or more control signals.

19. The method of claim 18, wherein the electronically tunable antenna matching circuit is tuned by generating the one or more control signals for the plurality of electronic switches to selectively enable respective capacitors of the plurality of capacitors and respective inductors of the plurality of inductors based on the set of circuit parameters determined for the electronically tunable antenna matching circuit.

20. The method of claim 19, wherein the set of circuit parameters includes a capacitance value and an inductance value based on the first magnitude measurement and the first phase measurement, and wherein the one or more control signals are based on a tune word selected from a lookup table including a plurality of tune words associated with respective capacitance and inductance values.

* * * * *